United States Patent
Fornara et al.

(10) Patent No.: US 10,249,679 B2
(45) Date of Patent: Apr. 2, 2019

(54) METHOD OF WIRELESS COMMUNICATION USING THERMOELECTRIC GENERATORS

(71) Applicant: STMicroelectronics (Rousset) SAS, Rousset (FR)

(72) Inventors: Pascal Fornara, Pourrières (FR); Christian Rivero, Rousset (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 36 days.

(21) Appl. No.: 14/979,282

(22) Filed: Dec. 22, 2015

(65) Prior Publication Data

US 2016/0111470 A1    Apr. 21, 2016

Related U.S. Application Data

(62) Division of application No. 13/659,622, filed on Oct. 24, 2012.

(30) Foreign Application Priority Data

Oct. 26, 2011 (FR) .................................. 11 59718

(51) Int. Cl.
*H01L 27/16* (2006.01)
*H01L 35/02* (2006.01)
(Continued)

(52) U.S. Cl.
CPC .............. *H01L 27/16* (2013.01); *H01L 23/38* (2013.01); *H01L 35/02* (2013.01); *H01L 35/34* (2013.01);
(Continued)

(58) Field of Classification Search
None
See application file for complete search history.

(56) References Cited

U.S. PATENT DOCUMENTS 5,637,921 A * 6/1997 Burward-Hoy ......... H01L 23/38
165/80.2
6,127,619 A  10/2000 Xi et al.
(Continued)

FOREIGN PATENT DOCUMENTS

FR        2946460 A1   12/2010
WO   2010010520 A2    1/2010
WO   2011012586 A1    2/2011

OTHER PUBLICATIONS

Carmo, J. et al., "A Planar Thermoelectric Power Generator for Integration in Wearable Microsystems," Sensors and Actuators A: Physical, 161, May 26, 2010, 6 pp.
Huesgen, T. et al., "Design and Fabrication of MEMS Thermoelectric Generators with High Temperature Efficiency," ScienceDirect, www.sciencedirect.com, Sensors and Actuators A, 145-146, 2008, 423-429, Jun. 28, 2007.
(Continued)

*Primary Examiner* — Eli S Mekhlin
(74) *Attorney, Agent, or Firm* — Slater Matsil, LLP

(57) ABSTRACT

Method of wireless communication between a first device and a second device, in which, the first device and the second device comprising respectively a first thermoelectric generator and a second thermoelectric generator, the two thermoelectric generators being in thermal coupling, a first signal is generated within the first device, the first thermoelectric generator is electrically powered as a function of the first signal so as to create a first thermal gradient in the said first generator and a second thermal gradient in the second generator, and a second signal is generated within the second device on the basis of the electrical energy produced by the second thermoelectric generator in response to the said second thermal gradient.

20 Claims, 7 Drawing Sheets

(51) Int. Cl.
*H01L 23/38* (2006.01)
*H01L 35/34* (2006.01)
(52) U.S. Cl.
CPC ............ *H01L 2224/16225* (2013.01); *H01L 2924/1461* (2013.01); *H01L 2924/15311* (2013.01)

(56) References Cited

U.S. PATENT DOCUMENTS

| | | | |
|---|---|---|---|
| 8,941,205 B2 | 1/2015 | Rivero et al. | |
| 2002/0134419 A1* | 9/2002 | MacRis | H01L 23/38 136/204 |
| 2003/0195408 A1* | 10/2003 | Hastings | A61B 5/04082 600/382 |
| 2004/0145049 A1* | 7/2004 | McKinnell | G11B 9/10 257/719 |
| 2005/0121064 A1* | 6/2005 | Seo | H01L 23/38 136/200 |
| 2007/0095381 A1 | 5/2007 | Lee | |
| 2007/0267740 A1* | 11/2007 | Khan | H01L 23/3128 257/712 |
| 2008/0136272 A1* | 6/2008 | Ishikawa | H02K 1/145 310/58 |
| 2009/0293928 A1 | 12/2009 | Liang et al. | |
| 2010/0239049 A1 | 9/2010 | Horisaki | |
| 2010/0259327 A1* | 10/2010 | Hou | H03G 3/3052 330/129 |

OTHER PUBLICATIONS

Kao, P. et al., "Fabrication and Characterization of CMOS-MEMS Thermoelectric Micro Generators," Sensors, 10, 1315-1325; doi 10.3390/s 100201315; www.mdpi.com/journal/sensors, Feb. 9, 2010, 11 pp.

Koester, D. et al., "Embedded Thermoelectric Coolers for Semiconductor Hot Spot Cooling," IEEE, May 30, 2006-Jun. 2 2006, 6 pp.

Lhermet, H. et al., "Efficient Power Management Circuit: From Thermal Energy Harvesting to Above-IC Microbattery Energy Storage," IEEE Journal of Solid-State Circuits, vol. 43, No. 1, Jan. 2008, 10 pp.

Ohta, H. et al., "Critical Thickness for Giant Thermoelectric Seebeck Coefficient of 2DEG Confined in SrTiO3/SrTi0.8Nb0.2O3 Superlattices," ScienceDirect, Thin Solid Films 516, www.sciencedirect.com, Oct. 13, 2007, 5 pp.

Vullers, R. et al., "Micropower Energy Harvesting," www.elsevier.com/locate/sse, Solid State Electronics, 53, Apr. 25, 2009, 10 pp.

Wang, Z. et al., "Realization of a Wearable Miniaturized Thermoelectric Generator for Human Body Applications," Sensors and Actuators A: Physical, 156, www.elsevier.com/locate/sna, Mar. 2009, 8 pp.

Yang, S. et al., "Design and Verification of a Thermoelectric Energy Harvester with Stacked Polysilicon Thermocouples by CMOS Process," Sensors and Actuators A: Physical, 157, Dec. 2009, 9 pp.

Yang, S. et al., "Development of a Thermoelectric Energy Harvester with Thermal Isolation Cavity by Standard CMOS Process," Jun. 17, 2009, 7 pp.

* cited by examiner

METHOD OF WIRELESS COMMUNICATION USING THERMOELECTRIC GENERATORS

This application is a divisional of U.S. application Ser. No. 13/659,622, filed on Oct. 24, 2012, which claims the benefit of French Application No. 1159718, filed on Oct. 26, 2011, entitled "Method of Wireless Communication between Two Devices, Especially within one and the same Integrated Circuit, and Corresponding System," which application is hereby incorporated herein by reference.

TECHNICAL FIELD

The invention relates to microelectronics, and more particularly to wireless communication between two devices, most particularly but not exclusively when these two devices are incorporated within one and the same integrated circuit, or else within a three-dimensional integrated structure.

BACKGROUND

Currently, the solution commonly used for the communication of data between two devices inside one and the same electronic chip is based on radiofrequency transmission. However, such solutions are expensive to implement, since they require the introduction of radiofrequency antennas into the chip.

SUMMARY

In one aspect, embodiments of the present invention provide for a method of wireless communication between a first device and a second device, in which, the first device and the second device comprising respectively a first thermoelectric generator and a second thermoelectric generator, the two thermoelectric generators configured to be thermally coupled. The method includes generating a first signal within the first device, and electrically powering the first thermoelectric generator as a function of the first signal so as to create a first thermal gradient in the first generator. The method further includes generating a second thermal gradient in the second generator, and generating a second signal within the second device on the basis of the electrical energy produced by the second thermoelectric generator in response to the second thermal gradient.

In another aspect, embodiments of the present invention provide for a wireless communication system. The wireless communication system includes a first device comprising a first thermoelectric generator, first generating means configured to generate a first signal, and power supply means configured to electrically power the first thermoelectric generator as a function of the first signal so as to generate a first thermal gradient in the first thermoelectric generator. The system further includes a second device including a second thermoelectric generator configured to be thermally coupled with the first thermoelectric generator, delivery means configured to deliver an electrical information cue in response to a second thermal gradient generated in the second thermoelectric generator on the basis of the first thermal gradient, and second generating means configured to generate a second signal as a function of the said electrical information cue.

In yet another aspect, embodiments of the present invention provide for a method comprising receiving an electrical signal having one of a first state and a second state, and generating a first thermal gradient in a first thermocouple in response to the electrical signal being in the first state. The method further includes generating a second thermal gradient in a second thermocouple caused by the first thermal gradient in the first thermocouple, and generating a second electrical signal caused by the second thermal gradient.

BRIEF DESCRIPTION OF THE DRAWINGS

Other advantages and characteristics of the invention will become apparent on reading the detailed description of wholly non-limiting modes of implementation and embodiments, and the appended drawings in which.

DETAILED DESCRIPTION OF ILLUSTRATIVE EMBODIMENTS

Figure 1:
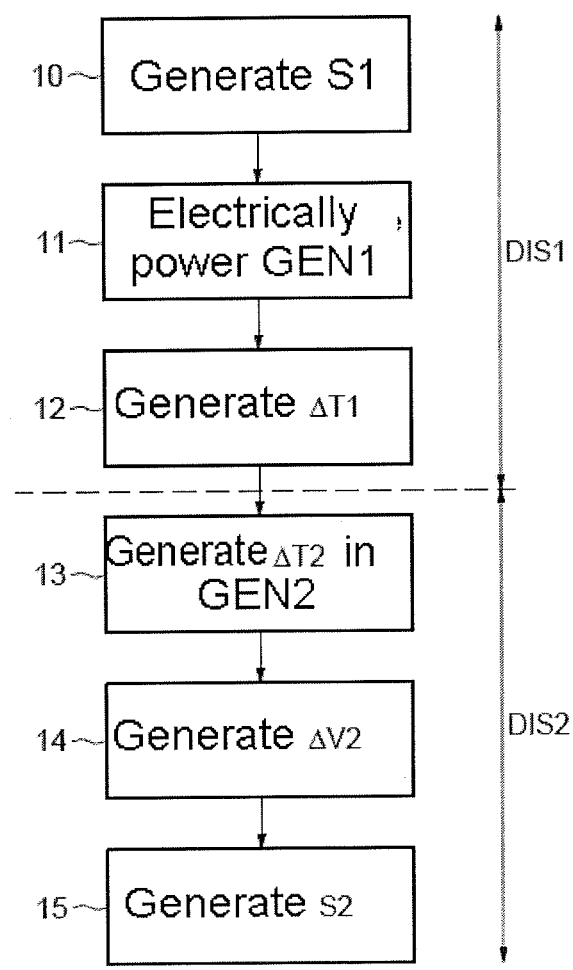
FIG. 1 schematically illustrates an exemplary implementation of a method according to the invention, FIGS. 2 to 4 schematically illustrate embodiments of a system according to the invention.

Before addressing the illustrated embodiments in detail, various embodiments and advantageous features thereof are discussed generally in the following paragraphs.

According to one mode of implementation, there is proposed a totally new method of wireless communication between two devices, in particular when these two devices are disposed inside one and the same electronic chip.

According to one mode of implementation and embodiment, it is proposed to insert a thermoelectric generator into each device, and to use for one, the Peltier effect and for the other, the Seebeck effect, to allow the wireless transmission of information between the two devices.

According to one aspect, there is proposed a method of wireless communication between a first device and a second device, the first device and the second device comprising respectively a first thermoelectric generator and a second thermoelectric generator, the two thermoelectric generators being in thermal coupling; a first signal is generated within the first device, the first thermoelectric generator is electrically powered as a function of the first signal so as to create a first thermal gradient in the first generator, and a second thermal gradient in the second generator, and a second signal is generated within the second device on the basis of the electrical energy produced by the second thermoelectric generator in response to the said second thermal gradient.

The two thermoelectronic generators may be placed in thermal coupling by for example disposing the two thermoelectric generators one alongside the other or else, at least in part one above the other.

It is possible to incorporate the first device and the second device within one and the same integrated circuit, or else within a three-dimensional integrated structure and more particularly within the linking device (or "interposer", according to an English term well known to the person skilled in the art) between the elements of the structure.

A particularly simple to implement but nonlimiting application of the method consists of the transmission of a logic information cue ("0" or "1") between the two devices.

More precisely, according to one mode of implementation in which the first signal is a first logic signal capable of taking a first logic state and a second logic state, and the second signal is a second logic signal capable of taking the first logic state and the second logic state, the first generator is electrically powered in the presence of the first logic signal having the first logic state, and the second logic signal having the first logic state is generated in the presence of the electrical energy produced by the second thermoelectric generator, while the second logic signal having the second logic state is generated in the absence of electrical energy produced by the second thermoelectric generator.

According to another aspect, there is proposed a wireless communication system, comprising a first device comprising a first thermoelectric generator, first generating means configured to generate a first signal, power supply means configured to electrically power the first thermoelectric generator as a function of the first signal so as to generate a first thermal gradient in the first thermoelectric generator, a second device comprising a second thermoelectric generator in thermal coupling with the first thermoelectric generator, delivery means configured to deliver an electrical information cue in response to a second thermal gradient generated in the second thermoelectric generator on the basis of the first thermal gradient, second generating means configured to generate a second signal as a function of the said electrical information cue.

Although all types of thermoelectric generators are suitable, it is particularly beneficial to use a thermoelectric generator which is compatible with the technologies and methods of fabrication already widely used in the field of microelectronics, in particular for the fabrication of embedded nonvolatile memories ("Embedded Memory") according to the denomination well known to the person skilled in the art, that is to say memories which are manufactured on the same integrated circuit as that containing another component, for example a processor, as opposed to external memory modules which are manufactured on an external specific integrated circuit different from that containing a processor.

It is in particular proposed to use already available layers of material, for example polysilicon, to manufacture the memory cells, and to do so without it being necessary to supplement the generator with additional masks or additional method steps with respect to the method for fabricating existing memory cells, or being necessary at the very least to supplement it with a few additional method steps which are particularly simple to implement.

Thus, when the two thermoelectric generators are disposed one alongside the other, provision may be made, according to one embodiment, for each thermoelectric generator to comprise a semiconducting substrate and parallel isolating regions, at least one set of thermocouples connected electrically in series and connected thermally in parallel, the said at least one set of thermocouples being situated in the substrate and comprising parallel semiconducting regions extending in the substrate, two neighbouring semiconducting regions having respectively one and the other of two opposite types of conductivity and being separated by an isolating region.

As a variant, according to another embodiment, still compatible with a placement one alongside the other of the two thermoelectric generators, each thermoelectric generator comprises a semiconducting substrate covered with an isolating layer, at least one set of thermocouples connected electrically in series and connected thermally in parallel comprising several parallel pairs of parallel semiconducting regions shrouded in an isolating material having respectively two opposite types of conductivity.

As a variant, the two thermoelectric generators may be disposed at least in part one above the other. And, according to one embodiment compatible with such a placement, one of the thermoelectric generators comprises a semiconducting substrate and parallel isolating regions, a set of thermocouples connected electrically in series and connected thermally in parallel, the said set of thermocouples being situated in the substrate and comprising parallel semiconducting regions extending in the substrate, two neighbouring semiconducting regions having respectively one and the other two opposite types of conductivity and being separated by an isolating region, and the other thermoelectric generator comprises the substrate and the parallel isolating regions and a set of thermocouples connected electrically in series and connected thermally in parallel, the said set of thermocouples comprising above each isolating region at least one pair of semiconducting regions shrouded in an isolating material having respectively two opposite types of conductivity.

Whatever the configuration, each thermoelectric generator furthermore comprises for example electrically conducting connection means ensuring the electrical link between the semiconducting regions of the set of thermocouples, these connection means being situated above the substrate and linking an end zone of a semiconducting region having one of the two types of conductivity to an end zone of a semiconducting region having the other type of conductivity.

According to one embodiment, the first signal being a first logic signal capable of taking a first logic state and a second logic state and the second signal being a second logic signal capable of taking the first logic state and the second logic state, the power supply means are configured to electrically power the first generator in the presence of the first logic signal having the first logic state, and the second generating means are configured to generate the second logic signal having the first logic state in the presence of the electrical information cue produced by the said delivery means and to generate the second logic signal having the second logic state in the absence of electrical information cue produced by the said delivery means.

According to another aspect, there is proposed an integrated circuit incorporating the system such as defined hereinabove.

According to another aspect, there is proposed a three-dimensional integrated structure comprising at least two elements electrically interconnected by a linking device, and furthermore incorporating the system such as defined hereinabove, this system possibly being for example at least in part incorporated in the linking device of the three-dimensional integrated structure.

In FIG. 1, two devices DIS1 and DIS2 each comprise a thermoelectric generator GEN1 and GEN2 (see, e.g., FIG. 2) disposed relatively to one another in thermal coupling. A first signal S1 is generated (10) within the first device and the first thermoelectric generator GEN1 is electrically powered (11) as a function of the first signal. Stated otherwise, the value of the current or of the voltage delivered at the terminals of the generator GEN1 depends on the value of the first signal S1. Consequently, on account of the Peltier effect, the electrical powering of the first generator GEN1 generates, in this generator, a first thermal gradient $\Delta T1$ (12).

While the two generators GEN1 and GEN2 are in thermal coupling, this first thermal gradient $\Delta T1$ generates (13) in the generator GEN2, a second thermal gradient $\Delta T2$. On account of the Seebeck effect, this second thermal gradient $\Delta T2$ generates, at the terminals of the second thermoelectric generator GEN2, electrical energy, for example a potential difference ΔV2 (14). A second signal S2 is then generated (15) in response to the said electrical energy produced.

Stated otherwise, the value of the signal S2 depends on the value of the electrical energy produced, for example the value of the potential difference ΔV2. A wireless communication is thus established between the device DIS1 and DIS2.

Figure 2:
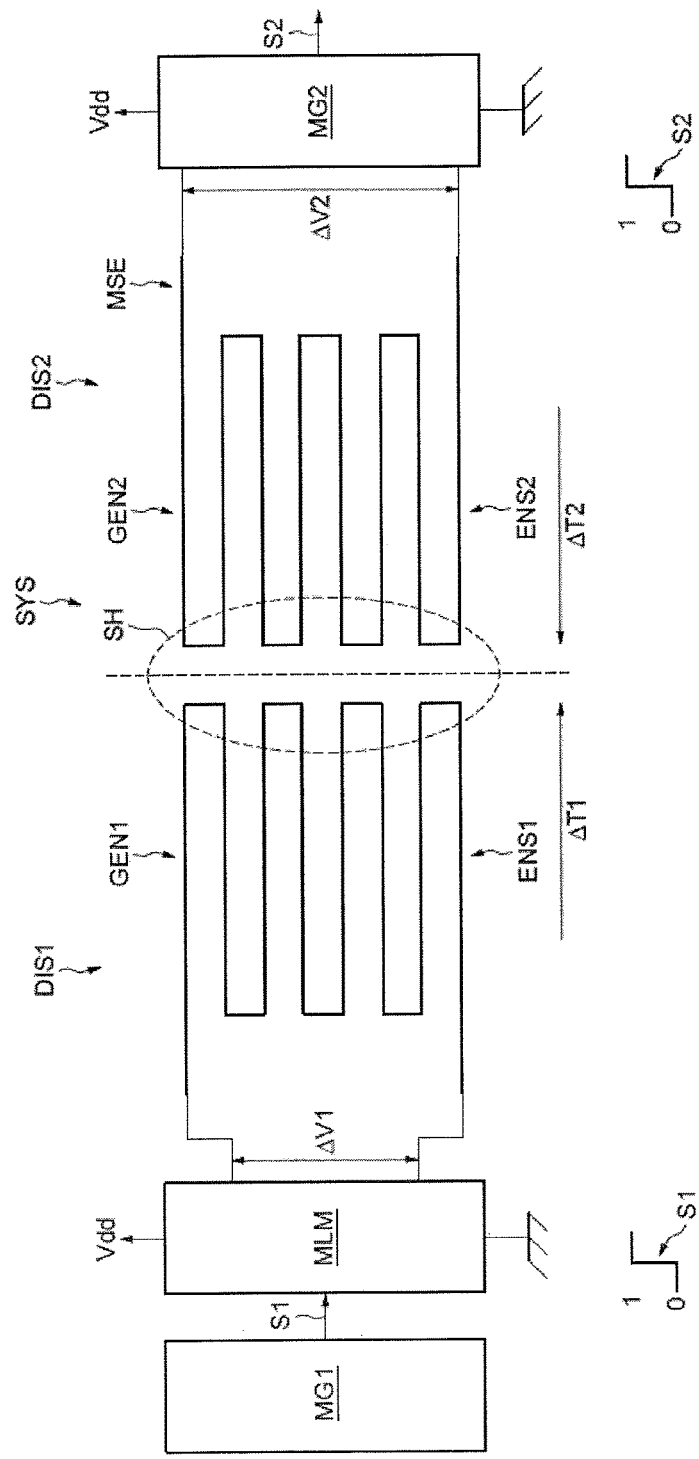

FIG. 2 illustrates very schematically an exemplary embodiment of a system SYS for wireless communication between the two devices DIS1 and DIS2, allowing especially the implementation of the method described in FIG. 1.

More precisely, the first device DIS1 comprises the first generator GEN1, first generating means MG1 configured to generate a first signal S1, power supply means MLM connected between a supply voltage Vdd and earth, and configured to electrically power the first thermoelectric generator GEN1 as a function of the first signal S1 so as to generate the first thermal gradient ΔT1 in the first thermoelectric generator.

In this regard, the power supply means MLM can generate a potential difference ΔV1 across the terminals of the generator GEN1, thus causing a current I1 to flow in this generator GEN1.

On account of the Peltier effect, the flow of the current I1 in the generator GEN1 will create the temperature gradient ΔT1 as well as a hot zone SH at an end of this first generator GEN1.

The second generator GEN2 of the device DIS12 being in thermal coupling with the first generator GEN1, an end of this second generator GEN2 is situated in the hot zone SH. And, as the other end is at a lower temperature, a second thermal gradient ΔT2 is therefore created in this second generator GEN2, thereby making it possible to produce as output from this generator a corresponding electrical information cue, for example a potential difference ΔV2.

The second device DIS2 then comprises delivery means MSE configured to deliver this electrical information cue to second generating means MG2 also connected between the supply voltage Vdd and earth. These second generating means MG2 are configured to generate a second signal S2 as a function of the said electrical information cue ΔV2.

By way of indication, the means MSE may be for example quite simply metallic tracks, or, when the thermoelectric generator GEN2 comprises bars (as will be seen in greater detail hereinafter), a corresponding prolongation of the bars.

In a particular example, the first generating means MG1 can comprise logic means configured to generate a first logic signal S1 liable to take a first logic state, for example the logic state "1", or else a second logic state, for example the logic state "0". The power supply means MLM will then electrically power the first generator GEN1 when the first logic signal S1 has the value 1, and will not power it in the converse case. Consequently, the two thermal gradients ΔT1 and ΔT2 will be generated only in the presence of a logic signal S1 having the value 1.

The second generating means MG2 are also configured, to deliver as signal S2, a logic signal capable of also taking the value "0" or the value "1". In this regard, the second means MG2 can also comprise logic circuits. And, in the presence of a nonzero potential difference ΔV2, the second means MG2 will deliver a logic signal S2 having the logic value 1, while in the presence of a zero potential difference ΔV2, the means MG2 will deliver a logic signal S2 having the logic value "0". Consequently, here the system SYS therefore readily allows the transmission of a logic information cue "0" or "1" between the two devices.

By way of example, the signal S1 may be a control signal for activating a specific block of the device DIS2. And, this specific block will be activated in response to the signal S2 having the logic value "1".

Any type of thermoelectric generator is suitable for the application of the invention. That said, thermoelectric generators comprise, in a conventional manner, a support and a set of thermocouples connected electrically in series and connected thermally in parallel. Thermocouples connected thermally in parallel are understood as being thermocouples intended to all be subjected to one and the same temperature gradient, for example when a heat source is disposed at one of the ends of the thermocouples, and when a cold source is disposed at the other end. A potential difference which is due to the Seebeck effect is then created at the two terminals of the set of thermocouples linked electrically in series.

Thermoelectric generators have formed the subject of numerous publications. Mention may especially be made of the article by Vullers et al., entitled "Micropower energy harvesting", Solid-State Electronics 53 (2009) 684-693, the article by Yang et al., entitled "Design and verification of a thermoelectric energy harvester with stacked polysilicon thermocouples by CMOS process", Sensors and actuators A157 (2010) 258-266, the article by Pin-Hsu Kao et al., entitled Fabrication and Characterization of CMOS-MEMS Thermoelectric Micro Generators, Sensors 2010, 10, 1315-1325, the article by Joao Paulo Carmo et al., entitled "A planar thermoelectric power generator for integration in wearable microsystems", Sensors and Actuators A161 (2010), 199-204, the article by S. M. Yang et al., entitled "Development of a thermoelectric energy harvester with thermal isolation cavity by standard CMOS process", Sensors and Actuators A153 (2009), 244-250, the article by Ziyang Wang et al., entitled "Realization of a wearable miniaturized thermoelectric generator for human body applications", Sensors and Actuators A156 (2009), 95-102, the article by Héléene Lhermet et al., entitled "Efficient Power Management Circuit: From Thermal Energy Harvesting to Above-IC Microbattery Energy Storage", IEEE Journal of Solid-State Circuits, Vol. 43, No. 1, January 2008, the article by Till Huesgen et al., entitled "Design and fabrication of MEMS thermoelectric generators with high temperature efficiency", Sensors and Actuators A145-146 (2008), 423-429, the article by David Koester et al., entitled "Embedded thermoelectric coolers for semiconductor hot spot cooling", 2006 IEEE, the article by Hiromichi Ohta et al., entitled "Critical thickness for giant thermoelectric Seebeck coefficient of 2DEG confined in SrTiO3/SrTi0.8Nb0.2O3 superlattices", Thin Solid Films 516 (2008), 5916-5920.

All these articles, the relevant teachings of which are incorporated herein by reference, describe either the general principles of thermoelectric generators based on the Seebeck effect, by using for example ceramic supports, or else describe generators using materials that are incompatible with CMOS technologies, such as piezoelectric materials, or else generators based on technological methods of the MEMS type (Micro Electro Mechanical System) and exhibiting cavities in the substrate under the thermocouples.

It is therefore possible to use, for each generator GEN1 and GEN2, one of the generators described in these publications, but without it being necessary to use two identical structures for the two generators.

The first generator GEN1 is based on the Peltier effect, which is the inverse effect of the Seebeck effect, while the second generator GEN2 is based on the Seebeck effect.

Figure 3:
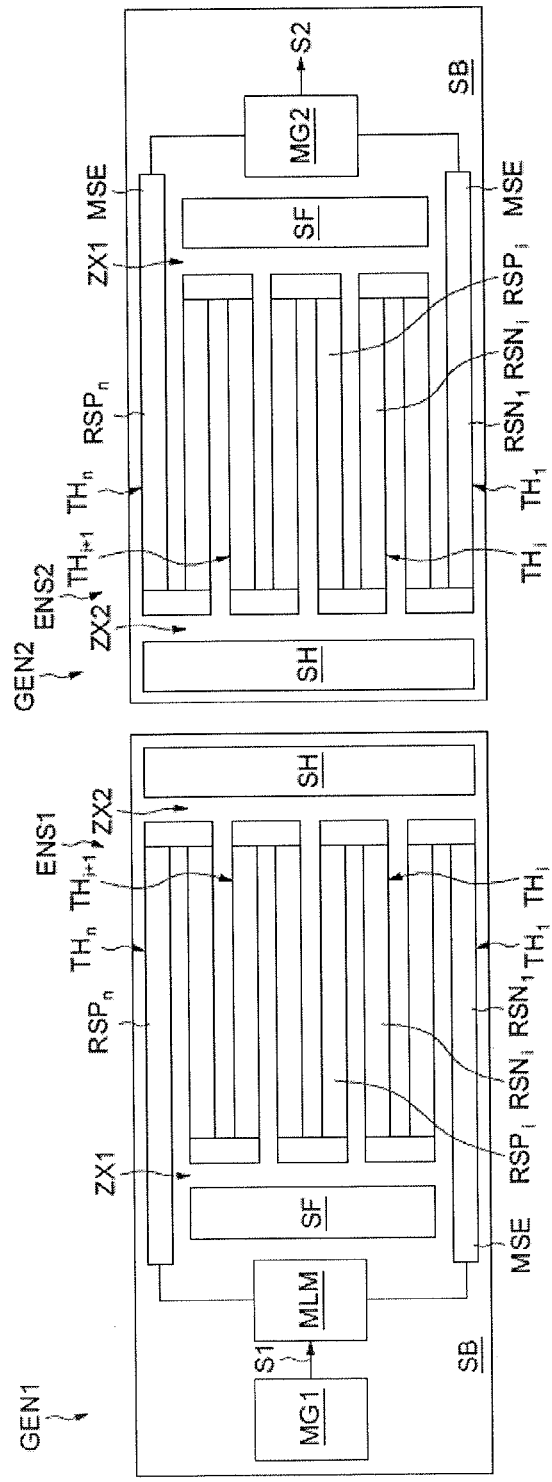

FIG. 3 illustrates in greater detail but still in a schematic manner, an exemplary embodiment of a thermoelectric generator. In this embodiment, the structure of the two generators is identical. For the sake of simplification, only the structure of the generator GEN1 will be described here.

The generator GEN1 is disposed within and/or on a semiconducting substrate SB, of for example silicon, and comprises a set ENS1 of thermocouples THi.

Here, each thermocouple THi comprises a bar-shaped semiconducting region, of N type of conductivity, referenced RSNi, and a semiconducting region of P type of conductivity, referenced RSPi also bar-shaped.

The two semiconducting regions of the thermocouple THi are parallel and linked electrically at one of their ends, and the whole set of thermocouples THi are linked electrically in series so as to form a chain of parallel bars alternately having the N type of conductivity and the P type of conductivity. The flow of a current in the thermocouple set ENS1 creates at the end ZX2 a hot source SH, and at the other end ZX1 a cold source SF.

As regards the second generator GEN2, the hot source SH is also situated at the level of the second end ZX2 of the thermocouple set ENS2, and the cold source at the level of the other end ZX1.

The thermocouples of the set ENS1 are connected thermally in parallel, that is to say they are connected so that they are all subjected together to the same temperature gradient.

In FIG. 3, the thermal coupling between the two generators GEN1 and GEN2 is performed by disposing the two generators side by side.

Figure 4:
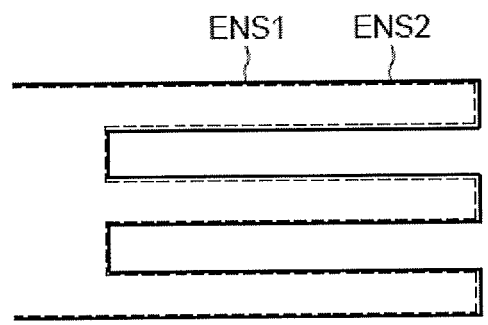

As a variant, it would be possible, as illustrated in FIG. 4, to place the two generators GEN1, GEN2, and more particularly their respective thermocouple sets ENS1 and ENS2, at least in part one above the other.

Figure 5:
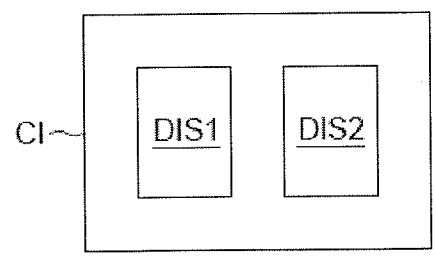
FIG. 5 illustrates very schematically an exemplary embodiment of an integrated circuit incorporating an exemplary system according to the invention.

In a particularly beneficial embodiment, provision is made to dispose the two devices DIS1 and DIS2 within one and the same integrated circuit CI. The devices DIS1 and DIS2 can then comprise different functional blocks of the integrated circuit and intended to communicate one with the other by wireless communication (FIG. 5).

In this case, it is particularly beneficial that each thermoelectric generator be compatible with the technologies and methods of fabrication already widely used in the field of microelectronics, in particular for the fabrication of embedded nonvolatile memories. It is possible in this regard, as will be described hereinafter, to use layers of material, for example polysilicon, already available to manufacture the memory cells.

An embodiment compatible with a conventional method for fabricating an embedded memory, and compatible with a side-by-side placement of the two generators will now be described while referring more particularly to FIG. 6 and FIG. 7.

Here again, the structure of the two generators GEN1 and GEN2 is identical and, for the sake of simplification, only the structure of the generator GEN1 is described here.

Figure 6:
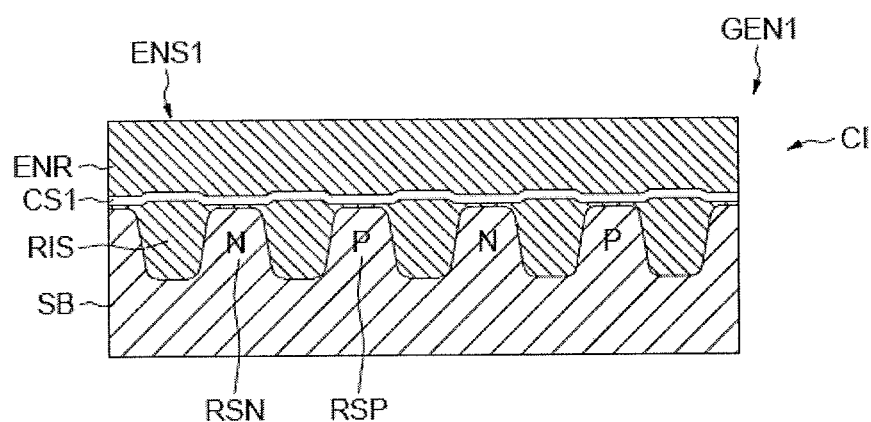
FIGS. 6 to 9 illustrate schematically other embodiments of thermoelectric generators that can be incorporated into embodiments of devices according to the invention, and FIG. 10 schematically illustrates an exemplary embodiment of an integrated structure according to the invention.
Figure 7:
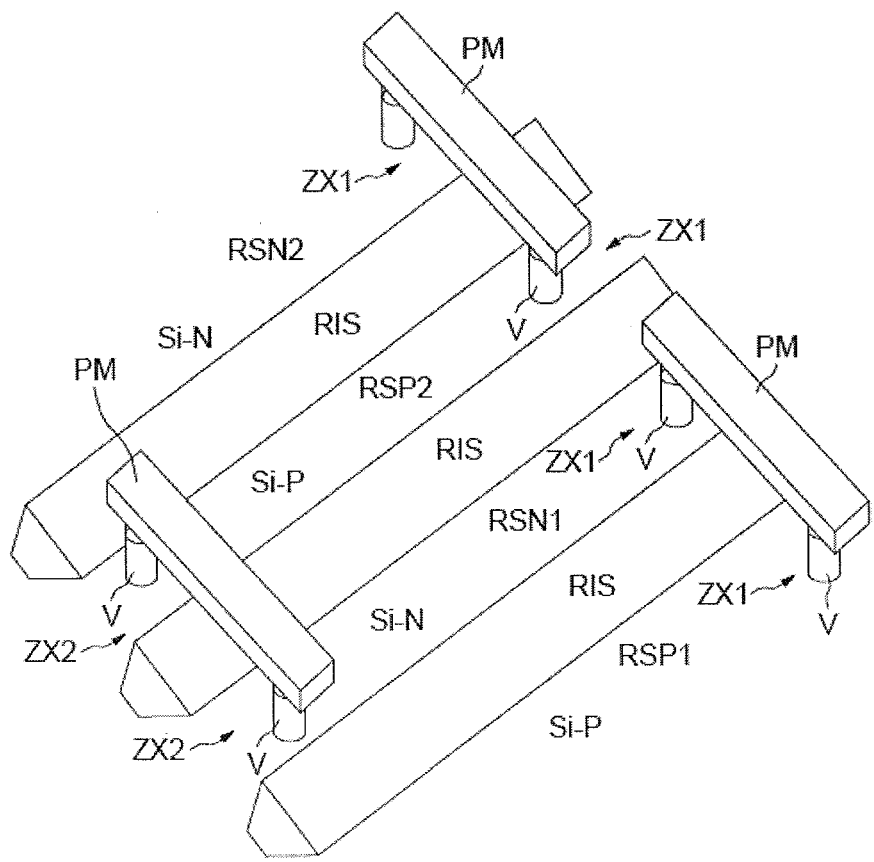

In FIG. 6, the support of the generator GEN (GEN1 or GEN2) comprises a semiconducting substrate SB, of for example silicon, within which are made parallel isolating regions RIS, for example regions of the STI (Shallow Trench Isolation) type.

The set of thermocouples ENS1 is situated in the substrate SB and comprises parallel semiconducting regions RSN, RSP extending in the substrate, two neighbouring semiconducting regions RSN, RSP having respectively one and the other of two types of conductivity, in this instance the N type of conductivity and the P type of conductivity, and are separated by an isolating region RIS.

The whole set is covered by an isolating layer CS1, for example a silicon nitride layer, itself covered with an isolating shroud ENR, of for example silicon dioxide SiO2.

The realization of such a generator is perfectly compatible with the conventional method for fabricating embedded memories, and does not require any modification of method nor any addition of mask level.

The isolating shroud ENR is for example that in which the metallization levels of the integrated circuit are made.

In this regard, and in a general manner, whatever structure of thermocouple set is used, the generator comprises electrically conducting connection means ensuring the electrical link between the semiconducting regions of the thermocouples, these connection means being situated above the substrate and linking an end zone of a semiconducting region having one of the two types of conductivity, for example the N type of conductivity, to an end zone of a semiconducting region having the other type of conductivity, for example the P type of conductivity.

For example, these connection means are shrouded in the isolating material ENR and comprise metallic tracks perpendicular to the semiconducting regions, and connected to the said end zones by vertical electrical links, for example contacts or vias.

And, so as to be compatible with conventional methods for manufacturing components, for example embedded memories, the metallic tracks of the connection means are situated on at least one of the metallization levels of the integrated circuit CI. This is illustrated more particularly in FIG. 7, which shows the means of connection of the generator of FIG. 6.

Thus, the end zone ZX1 of the semiconducting region RSN1 is electrically connected to the homologous end zone ZX1 of the region RSP1 by a metallic track PM straddling the isolating region RIS separating these two regions RSN1 and RST1, this metallic track being linked to the end zones ZX1 by vias V.

Likewise, the end zones ZX2 of the regions RSN1 and RSP2 are also connected together by a metallic track PM straddling the region RIS separating these two regions RSN1 and RSP2. This metallic track PM is connected to the end zones ZX2 by vias V.

Likewise, the two end zones ZX1 of the regions RSP2 and RSN2 are connected in the same manner by a metallic track PM straddling the isolating region RIS, this metallic track being connected to the zones ZX1 by way of vias V.

Figure 8:
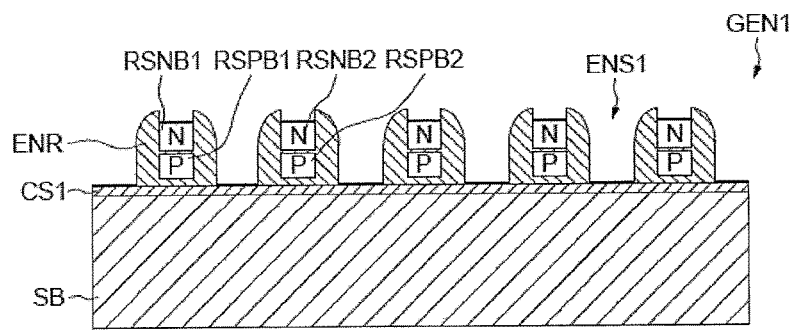

Another embodiment compatible especially with a side-by-side placement of the two generators GEN1 and GEN2 is illustrated in FIG. 8. Here again, the structure of each generator is identical, and only that of the generator GEN1 will be described.

The thermocouple set ENS1 comprises here, above the isolating layer CS1 covering the substrate SB, parallel pairs of parallel semiconducting regions RSPBi and RSNBi shrouded in an isolating material ENR and having respectively the two types of conductivity N and P.

Here again, the generator of FIG. 8 is perfectly compatible with methods for fabricating embedded non-volatile memories.

Figure 9:
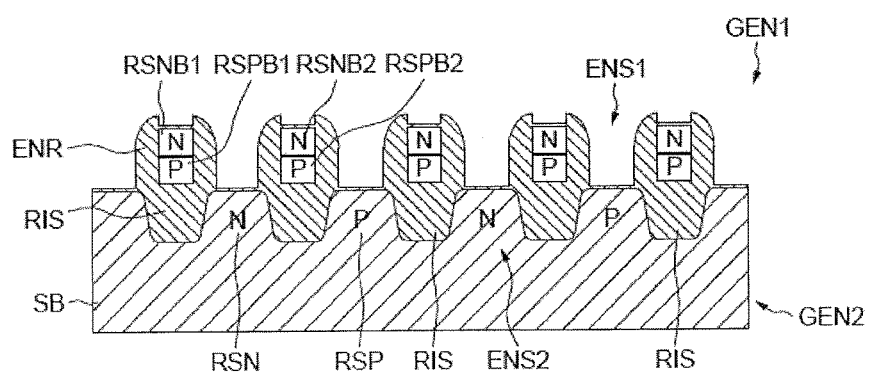

The embodiment of FIG. 9 is compatible with a placement one above the other of the two generators GEN1, GEN2, and is also compatible with a method of fabrication of the embedded memory type.

As may be seen in FIG. 9, the generator GEN1 exhibits a structure analogous to that described with reference to FIG.

8, while the generator GEN2 exhibits a structure analogous to that described with reference to FIG. 6. Of course, the structures of the two generators GEN1 and GEN2 could be reversed.

More precisely, the pairs of semiconducting regions RSPBi and RSNBi of the set ENS1 of the generator GEN1 are this time disposed above the parallel isolating regions RIS made in the substrate SB.

And, the set ENS2 of the generator GEN2 is formed here of the parallel semiconducting regions RSN and RSP respectively disposed between the parallel regions RIS.

Figure 10:
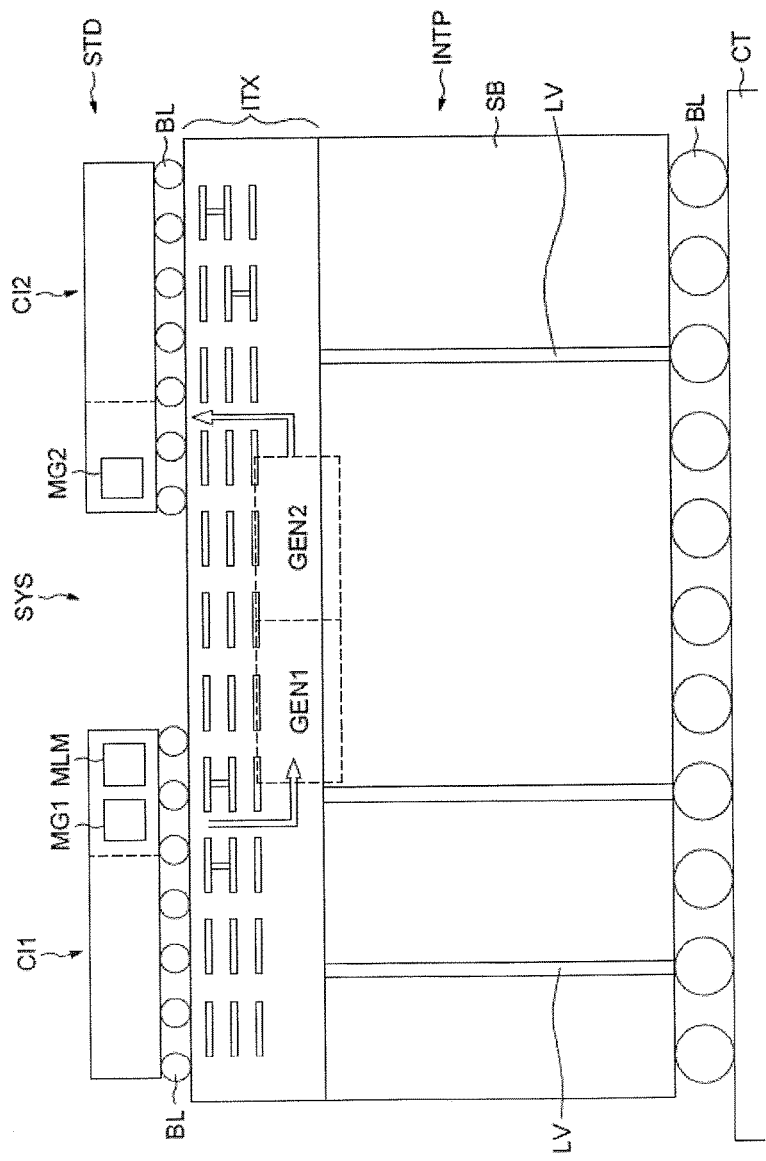

FIG. 10 is now referred to more particularly, to illustrate an embodiment of a three-dimensional integrated structure incorporating a system SYS such as that described for example with reference to the previous figures.

In FIG. 10, the reference STD designates the three-dimensional integrated structure, comprising a linking device or interposer INTP on the upper face of which are connected in this example two integrated circuits CI1 and CI2, for example by way of connection balls BL ("bumps").

Moreover, the integrated structure STD also comprises a third element, namely in this instance an integrated circuit card CT ("Printed Circuit Board": PCB) on which the lower face of the interposer INTP is connected, also by way of connection balls BL.

The interposer INTP comprises a substrate SB, generally of silicon, as well as an interconnection part INTX comprising several metallization levels, within which are manufactured metallic tracks linked together, in the case of some of them, by vias. The whole set of metallic tracks and vias is shrouded in an isolating shroud, of for example silicon dioxide, and makes it possible to ensure, in particular, electrical interconnection between the two integrated circuits CI1 and CI2.

The substrate SB also comprises electrically conducting vertical links LV, manufactured in the form of TSVs ("Through Silicon Vias") and making it possible to link electrically, for example, some of the metallic tracks of the interconnection part ITX with the balls BL so as to ensure a vertical electrical connection between at least one of the integrated circuits CI1 and CI2 with the card CT.

It is proposed here, according to one aspect of the invention, to use the interposer INTP to incorporate therein at least partially a wireless communication system SYS.

More precisely, the system SYS will allow wireless communication between the integrated circuit CI1 and the integrated circuit CI2.

In the example described here, the interposer INTP incorporates the generators GEN1 and GEN2, while the means MG1 and MLM of the device DIS1 are incorporated into the integrated circuit CI1, and the means MG2, which generate the signal S2, are incorporated into the integrated circuit CI2.

The generators GEN1 and GEN2 may be for example those described with reference to FIGS. 6 to 9.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method, comprising:
generating a first signal by a first device, the first signal having a first value or a second value;
electrically powering a first thermoelectric generator as a function of the first signal to generate a first thermal gradient in the first thermoelectric generator, wherein the first thermoelectric generator comprises a plurality of semiconducting regions disposed at least in part in an interconnect region of a first integrated circuit, the interconnect region being disposed above a semiconducting substrate of the first integrated circuit, wherein the interconnect region comprises a plurality of metallization layers disposed in one or more insulation materials, the plurality of semiconducting regions underlies the plurality of metallization layers, and wherein a first metallization layer of the plurality of metallization layers extends between a second metallization layer of the plurality of metallization layers and the plurality of semiconducting regions in a direction that is perpendicular to a major surface of the semiconducting substrate;
generating a second thermal gradient in a second thermoelectric generator, the second thermal gradient caused by the first thermal gradient; and
generating a second signal by a second device on a basis of electrical energy produced by the second thermoelectric generator in response to the second thermal gradient, the second signal having a third value or a fourth value, wherein when the first signal has the first value the second signal has the third value, and when the first signal has the second value the second signal has the fourth value.

2. The method according to claim 1, wherein the first and second thermoelectric generators are disposed beside each other in the first integrated circuit.

3. The method according to claim 1, wherein the first and second thermoelectric generators are disposed at least in part one above the other.

4. The method according to claim 1, wherein:
the first signal is generated by a first signal generator, and the first signal generator is disposed in the first integrated circuit; and
the second signal is generated by a second signal generator, and the second signal generator is disposed in the first integrated circuit.

5. The method according to claim 4, wherein the first signal is a control signal for activating a circuit in the first integrated circuit.

6. The method according to claim 1, wherein the first value and the third value are the same, and wherein the second value and the fourth value are the same.

7. The method according to claim 1, wherein the first signal is generated by a second integrated circuit, and the second integrated circuit is disposed over the interconnect region, and wherein the second signal is generated by a third integrated circuit, and the third integrated circuit is disposed over the interconnect region.

8. A method comprising:
receiving, by a first thermoelectric generator, a first logic signal having one of a first state or a second state, wherein the first thermoelectric generator is disposed in an integrated circuit, the first thermoelectric generator comprises a first set of thermocouples, the first set of thermocouples comprises a plurality of parallel semiconducting regions extending along a first surface of a semiconductor substrate of the integrated circuit, the plurality of parallel semiconducting regions are separated by a plurality of parallel isolating regions, and wherein the plurality of parallel semiconducting regions are electrically connected by a plurality of vias and a plurality of metallic tracks, the plurality of metallic tracks being disposed in a first metallization level of a plurality of metallization levels of an interconnect region of the integrated circuit, wherein the plurality of metallic tracks overlies the plurality of parallel semiconducting regions in a direction that is perpendicular to the first surface of the semiconductor substrate, wherein a first surface of the plurality of metallic tracks is closest to the plurality of parallel semiconducting regions but does not contact the plurality of parallel semiconducting regions, and wherein the plurality of vias extends between the first surface of the plurality of metallic tracks and the plurality of parallel semiconducting regions in the direction that is perpendicular to the first surface of the semiconductor substrate;

generating, by the first thermoelectric generator, a first thermal gradient in the first set of thermocouples in response to the first logic signal being in the first state;

communicating, by the first thermoelectric generator, the first logic signal to a second thermoelectric generator by generating a second thermal gradient in a second set of thermocouples, the second thermal gradient caused by the first thermal gradient in the first set of thermocouples;

generating, by the second thermoelectric generator, a second logic signal based on the second thermal gradient; and using the second logic signal as an input to a control circuit.

9. The method of claim 8, wherein generating the first thermal gradient comprises generating a first potential between two input terminals of the first set of thermocouples in response to the first logic signal.

10. The method of claim 8, wherein generating the second logic signal comprises generating a second voltage potential between two output terminals of the second set of thermocouples.

11. The method according to claim 8, wherein the second thermoelectric generator comprises a second set of thermocouples, the second set of thermocouples is disposed at least in part in the interconnect region of the integrated circuit, the interconnect region comprises the plurality of metallization levels, and the plurality of metallization levels is disposed above the first set of thermocouples and the second set of thermocouples.

12. The method according to claim 11, wherein semiconducting regions of the plurality of parallel semiconducting regions are electrically connected in series by the plurality of vias and the plurality of metallic tracks.

13. The method according to claim 8, wherein the first logic signal is generated by a first signal generator, and the first signal generator is disposed over the interconnect region, and wherein the second logic signal is generated by a second signal generator, and the second signal generator is disposed over the interconnect region.

14. A method comprising:
receiving a first signal by a first device, the first device disposed inside a first integrated circuit;
electrically powering a first thermoelectric generator as a function of the first signal so as to generate a first thermal gradient in the first thermoelectric generator, wherein the first thermoelectric generator is disposed underneath a plurality of metallization layers of an interconnect region, wherein the first integrated circuit is disposed on the interconnect region, and wherein the first thermoelectric generator and conductive features of the interconnect region are disposed in a same insulating material;
generating a second thermal gradient in a second thermoelectric generator, the second thermal gradient being caused by the first thermal gradient, the second thermoelectric generator being disposed underneath the plurality of metallization layers of the interconnect region in the same insulating material; and
generating a second signal by a second device on a basis of electrical energy produced by the second thermoelectric generator in response to the second thermal gradient, the second device being comprised within a second integrated circuit, the second integrated circuit being disposed on the interconnect region.

15. The method according to claim 14, wherein the first integrated circuit is coupled to the interconnect region by a plurality of conductive balls.

16. The method according to claim 14, wherein the interconnect region is comprised in an interposer, the interposer being electrically connected to a circuit board.

17. The method according to claim 16, wherein the first signal is a control signal for activating a circuit in the second integrated circuit.

18. The method according to claim 14, wherein the first thermoelectric generator comprises a plurality of parallel semiconducting regions.

19. The method according to claim 14, wherein the second thermoelectric generator comprises a plurality of parallel semiconducting regions.

20. The method according to claim 19, wherein semiconducting regions of the plurality of parallel semiconducting regions are electrically connected in series.

* * * * *